(12) United States Patent
Proye et al.

(10) Patent No.: US 10,804,226 B2
(45) Date of Patent: Oct. 13, 2020

(54) METHOD FOR MANUFACTURING CHIP CARDS AND CHIP CARD OBTAINED BY SAID METHOD

(71) Applicant: LINXENS HOLDING, Mantes la Jolie (FR)

(72) Inventors: Cyril Proye, Magnanville (FR); Eric Eymard, Polignac (FR)

(73) Assignee: Linxens Holding, Mantes la Jolie (FR)

( * ) Notice: Subject to any disclaimer, the term of this patent is extended or adjusted under 35 U.S.C. 154(b) by 0 days.

(21) Appl. No.: 16/098,203

(22) PCT Filed: May 3, 2017

(86) PCT No.: PCT/FR2017/051063
§ 371 (c)(1),
(2) Date: Nov. 1, 2018

(87) PCT Pub. No.: WO2017/191414
PCT Pub. Date: Nov. 9, 2017

(65) Prior Publication Data
US 2019/0157223 A1 May 23, 2019

(30) Foreign Application Priority Data

May 6, 2016 (FR) ...................................... 16 54102

(51) Int. Cl.
*H01L 23/66* (2006.01)
*G06K 19/077* (2006.01)
(Continued)

(52) U.S. Cl.
CPC ........ *H01L 23/66* (2013.01); *G06K 19/07722* (2013.01); *G06K 19/07747* (2013.01);
(Continued)

(58) Field of Classification Search
CPC ................. H01L 23/66; H01L 21/4857; H01L 23/49811; H01L 24/08; H01L 24/80;
(Continued)

(56) References Cited

U.S. PATENT DOCUMENTS

| 6,406,935 B2* | 6/2002 | Kayanakis ....... G06K 19/07749 438/106 |
| 2002/0008666 A1* | 1/2002 | Kushihi .................. H01Q 1/243 343/702 |
| 2003/0141103 A1* | 7/2003 | Ng .......................... H05K 1/111 174/250 |
| 2005/0212690 A1* | 9/2005 | Nishikawa ............. G06K 7/006 340/932.2 |

(Continued)

FOREIGN PATENT DOCUMENTS

| EP | 1 093 082 A2 | 4/2001 |
| FR | 2 863 747 | 6/2005 |

(Continued)

*Primary Examiner* — Marcos D. Pizarro
*Assistant Examiner* — Sue Tang
(74) *Attorney, Agent, or Firm* — Harrington & Smith

(57) ABSTRACT

The invention relates to a chip card manufacturing method. According to this method, there are produced on the one hand, a module including a substrate supporting contacts on one face, and bonding pads on the other, on the other hand, an antenna on a support. The ends of the antenna are linked to lands of connection lands receiving a drop of soldering material on a connection portion. In order to make the soldered electrical connection between the module and the antenna reliable, the bonding pads extend over a zone covering a surface area less than that of the connection portions. The invention relates also to a chip card whose module includes bonding pads extending over a zone covering a surface area less than that of the connection portions.

16 Claims, 3 Drawing Sheets

Figure 1:
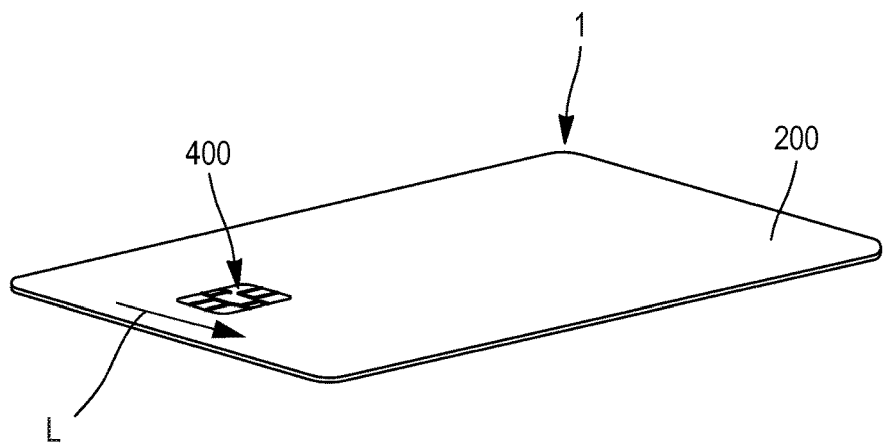

(51) Int. Cl.
*H01L 21/48* (2006.01)
*H01L 23/498* (2006.01)
*H01L 23/00* (2006.01)

(52) U.S. Cl.
CPC . *G06K 19/07754* (2013.01); *G06K 19/07769* (2013.01); *H01L 21/4857* (2013.01); *H01L 23/49811* (2013.01); *H01L 24/08* (2013.01); *H01L 24/80* (2013.01); *H01L 2223/6677* (2013.01); *H01L 2224/08052* (2013.01); *H01L 2224/08225* (2013.01); *H01L 2224/80801* (2013.01)

(58) Field of Classification Search
CPC ... H01L 2223/6677; H01L 2224/08052; H01L 2224/08225; H01L 2224/80801; G06K 19/07722; G06K 19/07747; G06K 19/07754; G06K 19/07769
See application file for complete search history.

(56) References Cited

U.S. PATENT DOCUMENTS

| | | | |
|---|---|---|---|
| 2006/0139901 A1 | 6/2006 | Meireles et al. | 361/760 |
| 2008/0283615 A1* | 11/2008 | Finn | G06K 19/077 235/488 |
| 2012/0248201 A1 | 10/2012 | Sutera | 235/492 |
| 2016/0293536 A1 | 10/2016 | Eymard | |
| 2017/0249545 A1 | 8/2017 | Eymard et al. | |
| 2017/0270398 A1 | 9/2017 | Mathieu et al. | |

FOREIGN PATENT DOCUMENTS

| | | |
|---|---|---|
| FR | 3 013 504 | 5/2015 |
| FR | 3 026 529 | 4/2016 |
| WO | WO 2006/070140 A1 | 7/2006 |
| WO | WO 2013/189757 A1 | 12/2013 |
| WO | WO 2015/071619 A1 | 5/2015 |
| WO | WO 2015/173514 A1 | 11/2015 |
| WO | WO 2016/051092 A1 | 4/2016 |

* cited by examiner

METHOD FOR MANUFACTURING CHIP CARDS AND CHIP CARD OBTAINED BY SAID METHOD

This patent application is a U.S. National Stage application of International Patent Application Number PCT/FR2017/051063 filed May 3, 2017, which is hereby incorporated by reference in its entirety, and claims priority to FR 1654102 filed May 6, 2016.

The invention relates to the field of chip cards. Chip cards are well known to the public, who have multiple uses therefor: payment cards, SIM cards for cell phones, transport cards, identity cards, etc.

The chip cards include transmission means for transmitting data from an electronic chip (integrated circuit) to a card reader device (reading) or from this device to the card (writing). These transmission means can be qualified as "contact", "contactless" or else dual-interface when they combine both of the above means. The invention makes it possible to produce in particular dual-interface chip cards. The dual-interface chip cards are called "dual" if the "contact" and "contactless" modes are managed by a single chip, or "hybrid" if the "contact" and "contactless" modes are managed by two physically distinct chips.

The dual-interface chip cards are generally composed of a rigid support made of plastic material of PVC, PVC/ABS, PET or polycarbonate type forming most of the card, in which an electronic module and an antenna that are manufactured separately are incorporated. The electronic module comprises a printed circuit, which is generally flexible, provided with an electronic chip and contact lands electrically connected to the chip and flush on the electronic module, at the surface of the support forming the card, for a connection by electrical contact with a card reader device. The dual-interface chip cards also include at least one antenna for transmitting data between the chip and a radiofrequency system allowing data to be read or written, contactlessly.

In the chip cards of "dual" type of the prior art, the electronic module comprising the contacts and the chip, on the one hand, and the antenna possibly incorporated in a support ("inlay"), on the other hand, are generally manufactured separately, then the antenna is connected to the module on which the chip is mounted and connected. The module and the antenna can possibly move slightly relative to one another during the use of the card, particularly when the card is subjected to twisting. Because of this, the connection between the antenna and the module, sometimes produced by soldering, can be broken.

One aim of the invention is to make this connection reliable.

This aim is at least partly achieved by virtue of a method for manufacturing a chip card comprising the production of a chip card module comprising a substrate having a first and a second main faces. On the first face of the substrate, contacts are produced for a temporary connection with a contact reading device. On the second face of the substrate, bonding pads are produced for connecting an antenna, for reading with a contactless device. This module is also provided with an electronic chip connected to at least some contacts and to at least two conductive tracks dedicated to a connection with the antenna.

According to this method, an antenna is also produced. The antenna comprises two ends. Possibly, the antenna is placed on an antenna support. The antenna is laminated between layers of plastic material. Then, the module is put in place in a cavity formed in at least some of the layers of plastic material.

Each of the ends of the antenna is connected, using a soldering material deposited on a connection portion, with a bonding pad of the module. To do this, once the module is in place in the cavity, the soldering material deposited on a connection portion is heated.

To make this connection reliable, the bonding pads are each produced on a zone covering a surface area less than that of a connection portion covered with soldering material.

In effect, in this way, the bonding pads are completely covered by the soldering material, particularly after the melting thereof. They are therefore gripped in the soldering material after connection. Thus, the surface of the bonding pads on which strains generated during displacement between the module and the card body can be applied is optimized and the strains are essentially limited to the zone corresponding to the surface of the bonding pads. Possibly, parts of the bonding pads can be lifted from the substrate of the module, which confers upon them a certain freedom of movement, without however breaking the connection between the module and the antenna.

This method also comprises one or other of the features of claims 2 to 7 considered alone or in combination with one or more others.

The method according to the invention can be implemented continuously ("reel-to-reel").

According to another aspect, the invention relates to a chip card as claimed in claim 8.

According to yet another aspect, the invention relates to a chip card module as claimed in claim 9, in particular for the production of a chip card as claimed in claim 8. This module comprises at least some of the features stated in claims 1 to 8 and in particular, it can comprise a bonding pad with at least one bar extending in a longitudinal direction over a length of between 1 and 7 mm (preferentially, this length is between 1.5 and 3 mm, for example it is 2.5 mm), and whose width is between 50 and 300 µm.

Possibly, in this chip card module, a bonding pad comprises at least two bars whose longitudinal ends are bent back and linked electrically.

Figure 2:
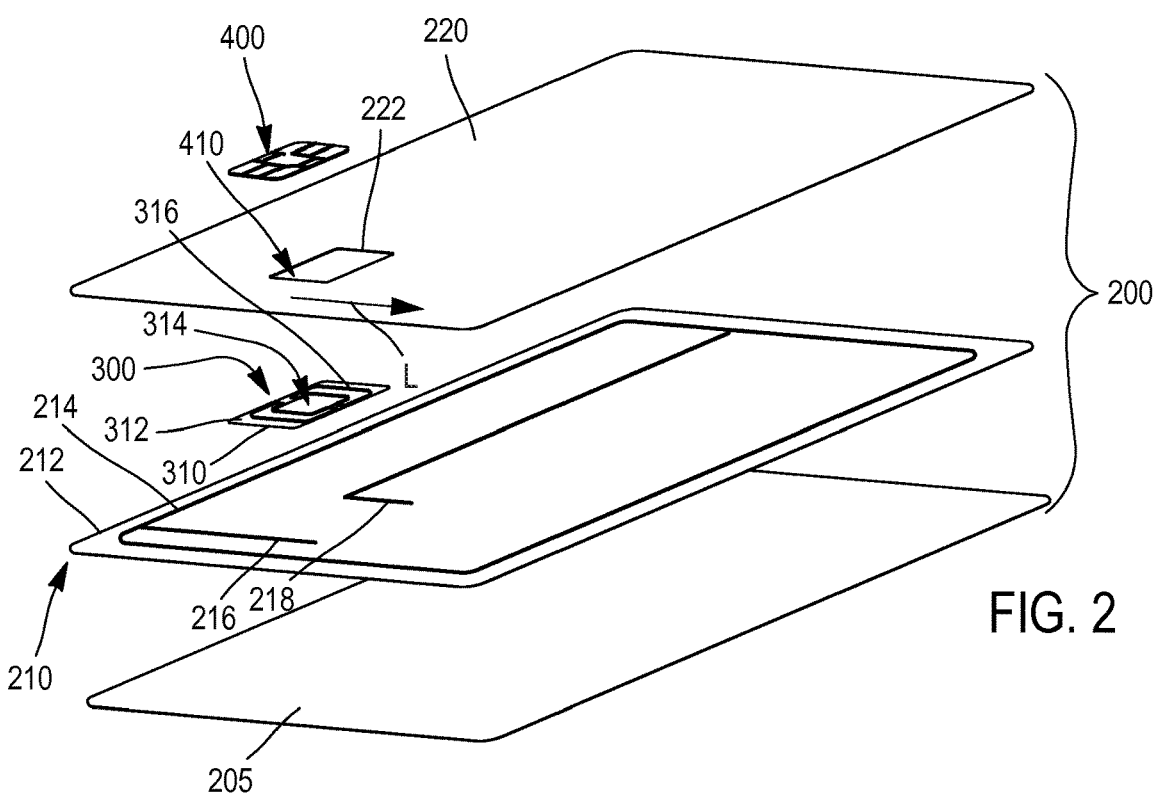
Figure 3:
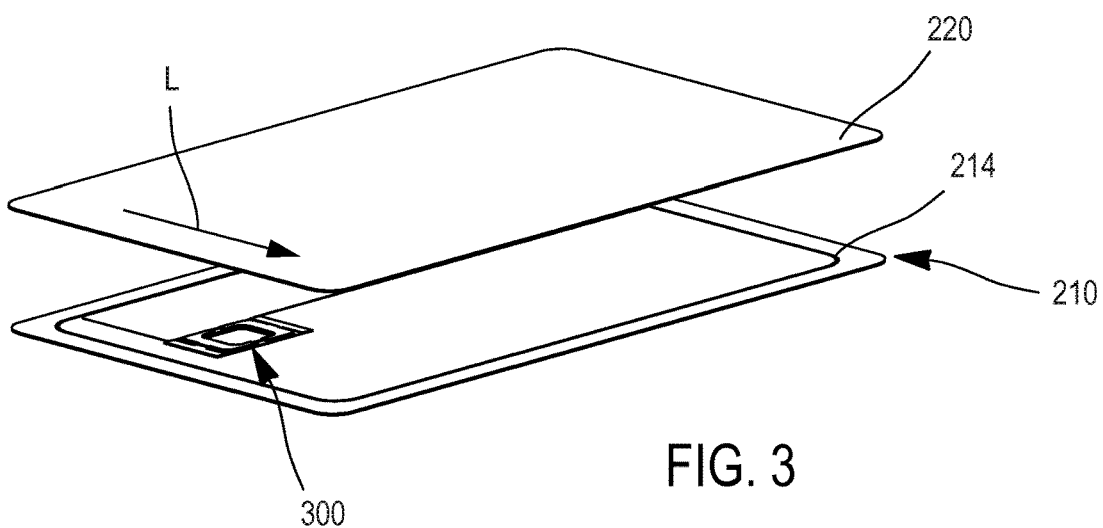
Figure 4:
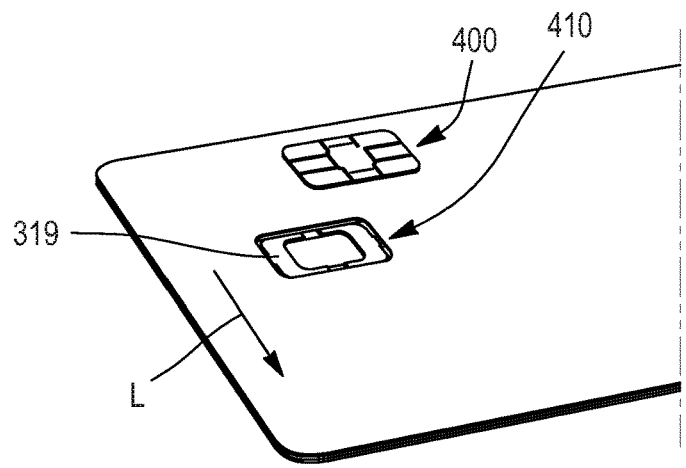
Figure 5:
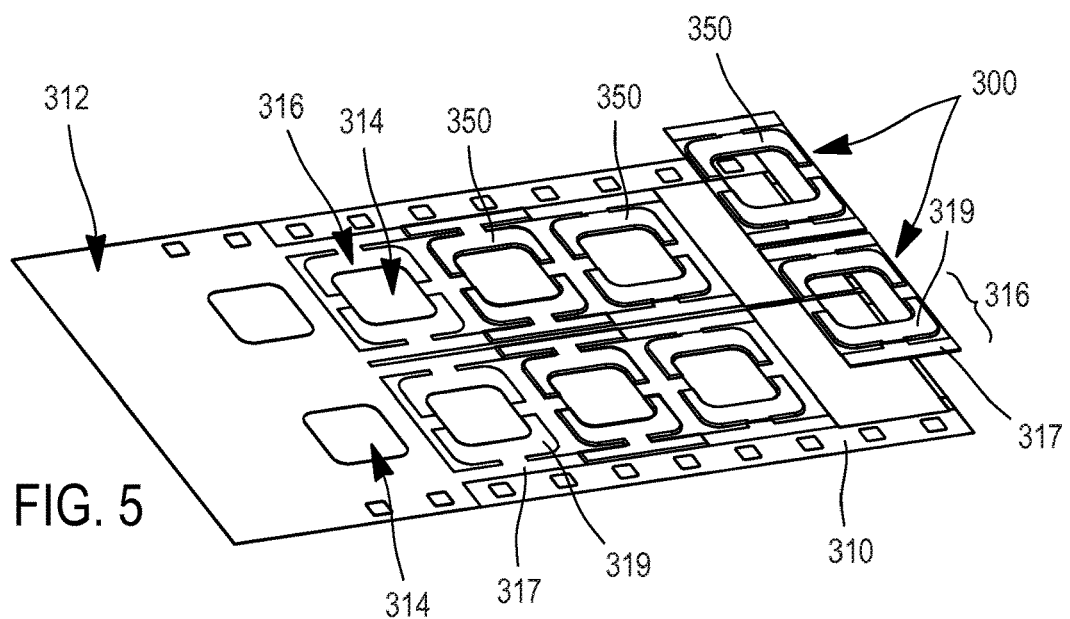
Figure 6:
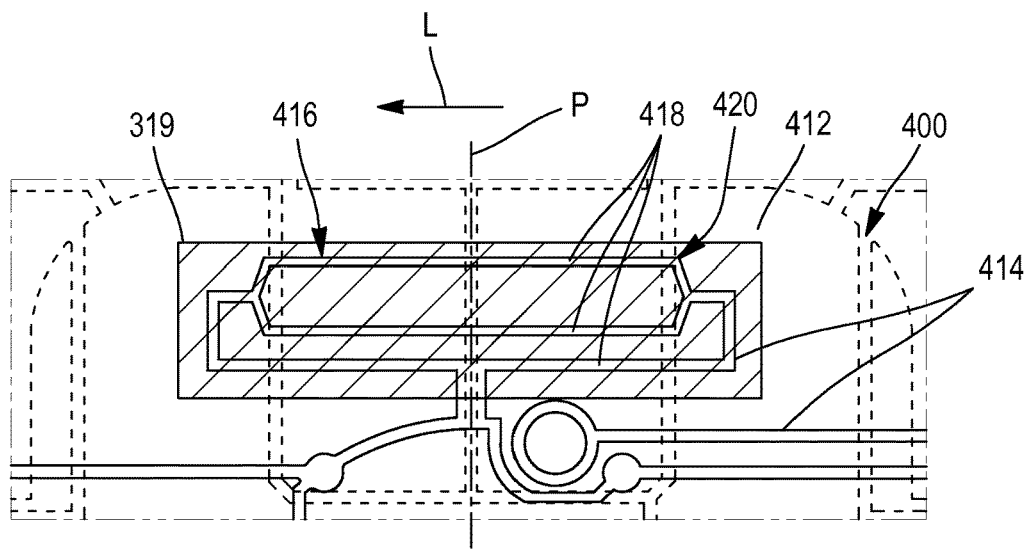
Figure 7:
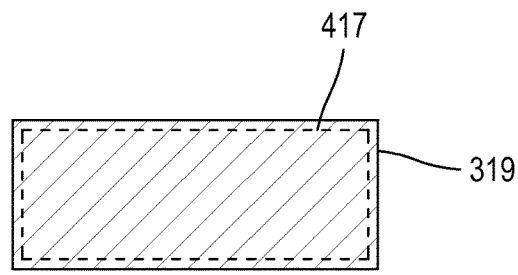
Figure 8:
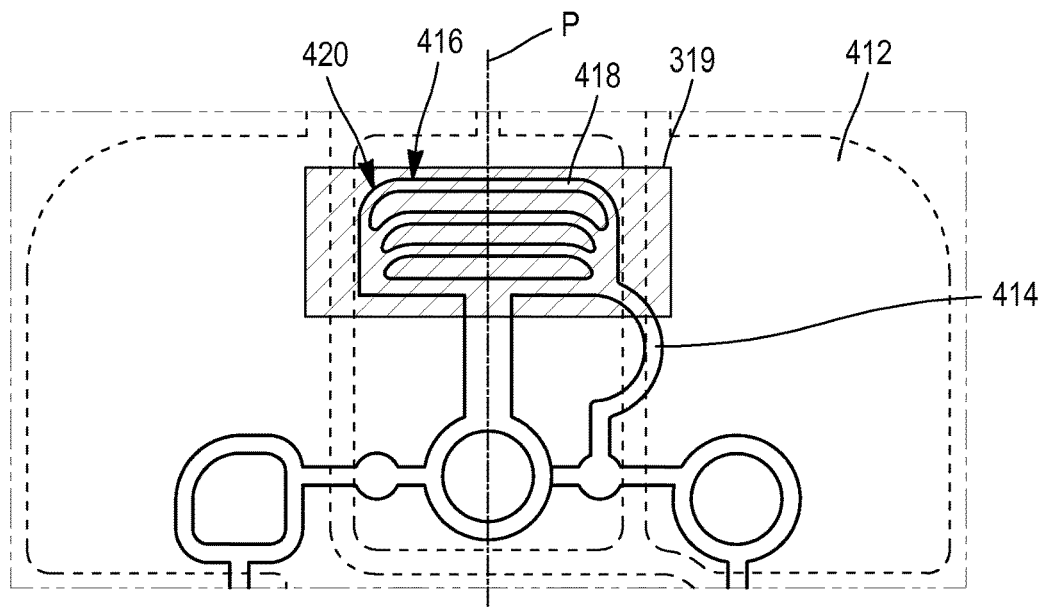
Figure 9:
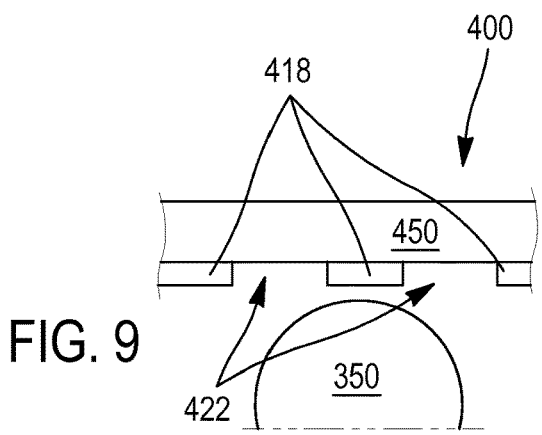

Other features and advantages of the invention will become apparent on reading the detailed description and the attached drawings in which:

FIG. 1 schematically represents, in perspective, a chip card according to an embodiment according to the invention;

FIG. 2 schematically represents, in perspective and in an exploded view, an example of stack of constituent layers of the chip card represented in FIG. 1;

FIG. 3 schematically represents, in perspective and in an exploded view, a variant of the embodiment of the chip card represented in FIG. 2;

FIG. 4 schematically represents the variant of the chip card of FIG. 3, after the milling of a cavity and before the insertion of a module according to the invention into the cavity;

FIG. 5 schematically represents, in perspective, different steps of a method for manufacturing a connection unit that can be used in the embodiments illustrated by FIGS. 1 to 4;

FIG. 6 schematically represents, in elevation, seen by its rear face, a first embodiment of a module according to the invention;

FIG. 7 schematically represents the relationship between the respective surfaces of the portions of the connection lands covered with the soldering material, on the one hand, and of the bonding pads, on the other hand;

FIG. 8 schematically represents, in elevation, seen by its rear face, another embodiment of a module according to the invention; and FIG. 9 schematically represents, in cross section, a portion of a bonding pad facing a drop of soldering material.

In the figures, the same references denote identical or similar elements.

In this document, the terms "front", "rear", "above", "below", etc., are purely conventional and, as necessary, refer to the orientations as represented in the figures.

The example of chip card 1 represented in FIG. 1 comprises a card body 200 and a module 400. Such a chip card 1 can be manufactured by several methods.

According to one implementation of the chip card manufacturing method according to the invention, represented in FIG. 2, the card body 200 is for example composed of a multilayer complex comprising different layers of plastic material, such as (from bottom to top in FIG. 2):

a bottom layer 205,
an antenna support 210,
a connection unit 300, and
a top layer 220.

The bottom layer 205 is, for example, a finishing layer (for printing for example) and a protective layer of the card 1. It is situated under the antenna support 310. It is made of PVC and its thickness is for example 0.20 mm, before lamination, and 0.18 mm, after lamination. The thickness of this bottom layer 205 is uniform.

The antenna support 210 comprises a substrate 212 made of PVC, for example 0.43 mm thick, before lamination, and 0.40 mm thick, after lamination. A wired antenna 214 is for example deposited on and fixed to the substrate 212 (for example embedded, by the technique called "wire embedding"). This antenna 214 is formed by several wound turns and is terminated by two ends 216, 218.

The connection unit 300 comprises a flexible film 310 with a first and a second main faces (see also FIG. 5). A conductive layer 312 is colaminated on one of these main faces. The substrate 310 is for example composed of a material of FR4 or VEP (epoxy glass) type, 0.075 mm thick (and more generally less than or equal to 0.1 mm). The conductive layer 312 is for example composed of a leaf copper alloy of 0.03 mm thick. The flexible film 310 is therefore, for example, of copper clad laminated type.

The connection unit 300 has, for example, a length of 18 mm and a width of 4.5 mm. An opening 314 of 8 mm by 4 mm, for example, is cut out substantially at the center of the connection unit 300. The connection unit 300 comprises two connection lands 316. Each connection land 316 comprises a first 317 and a second 319 portions, electrically connected to one another (see also FIG. 5). The first portion 317 has an essentially rectangular form. The second portion 319 has, for example, a U shape extending around the openings 314, with the bottom of the U linked (connected) essentially to the middle of the first portion 317 considered in its longitudinal direction. According to another example that is not represented, each connection land has the form of an "H" with each of the parallel branches of the "H" corresponding respectively to a first or a second portion of the metalized zone, these first and second portions being connected by the middle branch.

As represented in FIG. 5, connection units 300 are produced (for example continuously, reel-to-reel), from a flexible film 310. This flexible film 310 is cut (for example by punching) to form the openings 314 intended to receive the encapsulation resin of a module 400, as explained later. Sprocket holes are also cut out. The conductive layer is then etched (for example according to photolithography etching techniques) to form the connection lands 316 (two connection lands 316 per connection unit 300), with their first 317 and second 319 portions.

Soldering material 350 is then deposited on each of the first 317 and second 319 portions of the connection lands 316, for example to a thickness of between, for example, 0.02 to 0.5 mm. The soldering material 350 is for example composed of a tin-bismuth alloy. The soldering material 350 is then removed from the first portions 317. Finally, the connection units 300 are cut out to be individualized. Alternatively, the soldering material 350 is deposited more selectively, for example in the form of a drop of solder, only on each of the second portions 319 of the connection lands 316. The deposition of the soldering material 350 on the second portions 319 (but, as indicated above, possibly also on the first portions 317) of the conductive layer of the connection lands 316 is performed for example by dispensation, by screen printing or even by the so-called "wave" technology (this technology makes it possible to deposit soldering material 350 over thicknesses of the order of 100 or 200 μm, or even less, and over small surface areas, such as 3×4 mm$^2$ for example). Each drop of soldering material 350, once deposited on a second portion 319 and before the heating operation to produce the solder joint between the connection unit 300 and the module 400, forms a dome having a height of between 0.02 and 0.5 mm. Each drop of soldering material 350, during the heating, has to come into contact with the bonding pads 416 (see FIGS. 6 to 8). The wettability of the molten soldering material 350 can possibly suffice to establish the connection, even in the case where a drop of soldering material 350 would be only flush with the surface of the cavity 410 on which the module 400 comes to be housed (see FIGS. 2 and 4). However, an inadequate or failing contact by virtue of inadequate wettability can be avoided by adapting the height of each drop of soldering material 350 in such a way that this height is greater than the distance which separates the top of the drop of soldering material 350 from the bonding pad 416 situated under the module 400.

After having placed a connection unit 300 (possibly glued) on or in the antenna support 210, the ends 216, 218 of the antenna 214 are connected (for example by thermocompression) to the first portions 317 of the connection lands 316. This assembly, composed of the antenna 214 and of the connection unit 300 on the support 210, can be covered with a layer of plastic material to form a structure which can be sold to be laminated with one or more other layers of plastic material in order to produce a chip card 1.

Returning to the description of the stack of the layers of plastic material, in relation to FIG. 2, it will be noted that the antenna support 210 can be composed of at least two sublayers. In this case, the antenna is inserted for example between the bottom sublayer and the top sublayer. The top sublayer then comprises a cutout to receive a connection unit 300.

The top finishing and protection layer 220 is also for example made of PVC. It is 0.20 mm thick before lamination and 0.18 mm thick after lamination. This top finishing and protection layer 220 comprises a cutout 222 corresponding to a cavity 410.

Alternatively, according to the variant illustrated by FIGS. 3 and 4, rather than producing a cutout 222 in the one or more various laminated layers above the antenna support 210, the top layer 220 is laminated with the antenna support 210 (and possibly the other constituent layers of the card body 200) without the latter being previously cut out (FIG.

3). Then, the cavity 410 is milled to reveal the second portions 319 of the connection lands before connection and fixing of the module 400 in the cavity 410. Advantageously, during the milling of the cavity 410, a part of each drop of soldering material 350 is removed, to ensure that the plastic material in which the milling is performed will prevent neither the convergence of the surfaces to be soldered, nor the material forming the drops of soldering material 350 by melting from wetting the conductive tracks of the module 400 on which they have to be soldered. The first portions 317 of the connection lands 316, to which the ends 216, 218 of the antenna 214 have been connected, are outside of the milled zone and remain protected by the top layer 220.

The bottom layer 205 and the top layer 220, and the antenna support 210, are not necessarily single layers. Each of them can possibly be composed of one or more layers, all laminated together in the finished card 1.

The total thickness of the assembly of the layers 205-220, and therefore of the card 1, is roughly 0.8 mm after lamination.

A so-called "dual-face" module 400 is produced, for example in a known manner, on a substrate comprising contacts 412 on one face (called "contact face" or "front face"), and conductive tracks 414 (and an electronic chip that is not represented) on the other (called "rear face" or "bonding face") (see FIGS. 6 and 8). The fixing of the electronic chip onto the substrate is performed by at least one known technique such as chip fixing ("die-attach") and its electrical connection to the conductive tracks 414 is performed by at least one known technique such as the flip chip, wire bonding or other such technology. The chip and its possible connections by wires to the conductive tracks 414 are advantageously protected by encapsulation in a resin ("globe top" or "dam&fill", corresponding to a UV or thermal encapsulation). Since the chip is placed on the rear face of the substrate or in a cutout produced therein, the encapsulation is done from this rear face and can form an excess thickness relative to that of the latter.

As represented in FIGS. 6 and 7, the conductive tracks 414 comprise bonding pads 416. These bonding pads 416 are used to solder the second portions 319 of the connection lands 316. Thus, the ends 216, 218 of the antenna 214, are themselves electrically linked to the first portions 317, linked to the second portions 319, which themselves are soldered to the bonding pads 416 linked electrically on the rear face of the module 400 to the chip by the conductive tracks 414.

As schematically illustrated by FIG. 7, each bonding pad 416 extends in a zone 417 (delimited by dotted lines in FIG. 7) covering a surface area less than that of the second portions 319 (in FIGS. 6 to 8, the second portions 319 are represented in the form of a shaded rectangle, but they can have other forms, in particular that of a "U" represented in the preceding figures). The zone 417 can be defined as being that which contains bars 418 and the conductive tracks which link the bars 418 to one another. The bars 418 are elongate in a direction L essentially at right angles to the largest side of the module 400, which is generally intended to be parallel to the length of the card 1. The longitudinal direction L is represented in FIGS. 1 to 4.

In the embodiment represented in FIG. 6 (which corresponds for example to a module 400 with eight contacts—called "8-pin"), there are three of the bars 418.

Each bar 418 is relatively thin so as to be able, if necessary, to be separated from the substrate of the module 400 to absorb, without breaking, a significant strain. It has a width I for example of between 50 μm and 300 μm. More particularly, it can have a width close to 100 μm. By having a thin width it is possible for them to be lifted if necessary from the substrate 450 of the module 400.

The bars 418 for example have a length of between 1 and 7 mm. The bars 418 represented in FIGS. 6 and 8 are essentially rectilinear, but they could be wavy, sinusoidal, etc.

So as to be able to absorb the strain as uniformly as possible, the bars 418 are essentially symmetrical relative to a plane P at right angles to the substrate of the module 400 and to the longitudinal direction L, and passing through the middle of the module 400.

The bars 418 are joined at each of their longitudinal end and are connected to the conductive tracks 414.

In order to reduce the strains that are likely to build up at the ends of the bars 418, the ends thereof are terminated by bent-back portions 420. The radii of curvature of the bent-back portions make it possible to distribute the strains over a greater length and a greater surface area.

In the embodiment represented in FIG. 8 (which corresponds for example to a module 400 with six contacts—called "6-pin") there are three of the bars 418 and the bent-back portions 420 of the longitudinal ends of the bars are directed toward the inside of the module. In this embodiment, the two bars 418 furthest away from the center of the module 400 have, for example, a width of 100 μm and the one closest to the center has a width of 150 μm. Their length is preferentially between 1.5 and 3 mm; for example it is 2.5 mm.

To continue the manufacturing of the chip card 1, the module 400 is put in place in the cavity 410, with the soldering material 350, arranged on each of the second portions 319 of the connection lands 316, facing the bonding pads 416.

The zones of the module 400 located level with the drops of soldering material 350 are then heated up, for example using a thermode, to melt the soldering material 350 and solder the connection lands 316 to the bonding pads 416 (this heating operation is possibly performed at the same time as that consisting in heating the thermo-reactivatable adhesive zones, very close to the drops of soldering material that make it possible to glue each module in its cavity). By choosing a soldering material 350 that has a melting point of between 120° C. and 230° C., and more preferentially between 130 and 150° C., the operation of heating of the soldering material 350 can be performed by applying, with a thermode for example, a temperature of between 120° C. and 250° C. to a zone of the module 400.

Because of the thickness of the module 400 and of the height of the dome of a drop of soldering material 350, when the soldering material melts, it wets the corresponding bonding pad 416.

Moreover, as represented in FIG. 9, the spaces between the bars 418 form grooves 422, delimited on one side by the flanks corresponding to the thickness of the bars 418 and, on the other side, by the substrate 450 of the module 400. These grooves 422 make it possible to channel the soldering material 350 and avoid having the latter spread widely out of the zone 417 in which a bonding pad 416 is inscribed.

Possibly, the soldered joint between the connection lands 316 and the bonding pads 416 can cover a surface area at least of the order of 2 $mm^2$ and is such that a tearing force of the module 400 is obtained that is sufficiently high to meet the specifications of this type of product. The soldering material 350 this makes it possible, if necessary, not only to establish an electrical connection between the bonding pads 416 and the connection lands 316, but also to fix the module 400 in the cavity 410 without the use of other adhesive.

Hereinabove, a chip card structure 1 has been described in which a connection unit is used to make the connection between the antenna 214 and the module 400. However, the invention applies equally to a structure in which an antenna and connection lands are located on one and the same substrate (for example the antenna and the connection lands are etched on one and the same substrate which then forms an antenna support 210).

The invention claimed is:

1. A method for manufacturing a chip card, comprising:
production of a chip card module comprising a substrate having a first main face and a second main face, with contacts on the first main face of the substrate and bonding pads on the second main face of the substrate, the module being provided with an electronic chip connected to at least some contacts and connected to at least two conductive tracks for an antenna connection,
production of an antenna comprising two ends,
lamination of the antenna between layers of plastic material, and
placement of the module in a cavity formed in at least some of the layers of plastic material,
connection of the two ends of the antenna, using a soldering material deposited on a connection portion of each of the two ends of the antenna, with bonding pads of the module, and heated up, once the module is in place in the cavity,
wherein the bonding pads are each produced on a zone covering a surface area less than a surface area of the connection portions covered with the soldering material, so that the bonding pads are completely covered by the soldering material.

2. The method as claimed in claim 1, in which at least one of the bonding pads is produced comprising at least one bar extending longitudinally in a direction (L) over a length of between 1 and 7 mm.

3. The method as claimed in claim 1, in which at least one of the bonding pads is produced comprising at least one bar whose width is between 50 and 300 µm.

4. The method as claimed in claim 1, in which at least one of the bonding pads is produced comprising at least one bar extending longitudinally in a direction (L) essentially at right angles to the length of the module.

5. The method as claimed in claim 1, in which at least one of the bonding pads is produced comprising at least one bar whose ends are bent back toward the inside of the module.

6. The method as claimed in claim 1, in which at least one of the bonding pads is produced comprising at least two bars linked electrically by their longitudinal ends.

7. The method as claimed in claim 1, in which a connection unit is produced and the ends of the antenna are connected on one side to first portions of the connection unit and on the other side a drop of soldering material is deposited on second portions of the connection unit to produce a solder joint with each of the bonding pads.

8. A chip card comprising:
an antenna comprising two ends,
layers of plastic material between which the antenna is placed, and
a module comprising a substrate having a first main face and a second main face, with contacts on the first main face of the substrate, and bonding pads on the second main face of the substrate, the module being provided with an electronic chip connected to at least some contacts and to at least two conductive tracks for an antenna connection, the module being located in a cavity formed in at least some of the layers of plastic material,
a connection portion, linked to each of the ends of the antenna and comprising soldering material such that the connection portion is soldered to the bonding pads of the module,
wherein the bonding pads each cover a zone having a surface area less than a surface area of the connection portion covered with the soldering material, the bonding pads being completely covered by the soldering material.

9. The chip card as claimed in claim 8 where at least one of the bonding pads comprises at least one bar extending longitudinally in a direction (L) over a length of between 1 and 7 mm.

10. The chip card as claimed in claim 8 where at least one of the bonding pads comprises at least one bar whose width is between 50 and 300 µm.

11. The chip card as claimed in claim 8 where at least one of the bonding pads comprises at least one bar extending longitudinally in a direction (L) essentially at right angles to the length of the module.

12. The chip card as claimed in claim 8 where at least one of the bonding pads comprises at least one bar whose ends are bent back toward the inside of the module.

13. The chip card as claimed in claim 8 where at least one of the bonding pads comprises at least two bars linked electrically by their longitudinal ends.

14. The chip card as claimed in claim 8 where a connection unit is provided and the ends of the antenna are connected on one side to first portions of the connection unit and on the other side a drop of soldering material is located on second portions of the connection unit to produce a solder joint with each of the bonding pads.

15. A chip card module comprising a substrate having a first main face and a second main face, with contacts on the first main face of the substrate, and bonding pads on the second main face of the substrate, the module being also intended to be provided with an electronic chip connected to at least some contacts and to at least two conductive tracks for an antenna connection, the substrate comprising a cavity formed in at least one layer of plastic material covering the antenna and configured to receive the module, the module being intended to be connected to a connection portion linked to each of the ends of an antenna and comprising soldering material,
where the bonding pads each cover a zone having a surface area less than a surface area of the connection portion covered with the soldering material, and where at least one of the bonding pads comprises at least one bar extending longitudinally in a direction (L) over a length of between 1 and 7 mm and whose width is between 50 and 300 µm.

16. The chip card module as claimed in claim 15, in which a bonding pad comprises at least two bars whose longitudinal ends are bent back and linked electrically.

* * * * *